(12) United States Patent
Hu et al.

(10) Patent No.: US 11,032,933 B2
(45) Date of Patent: Jun. 8, 2021

(54) STORAGE DEVICE

(71) Applicant: CHENBRO MICOM CO., LTD., New Taipei (TW)

(72) Inventors: Tung-Yang Hu, New Taipei (TW); Shun-Chien Cheng, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 16/879,785

(22) Filed: May 21, 2020

(65) Prior Publication Data

US 2020/0375058 A1 Nov. 26, 2020

(30) Foreign Application Priority Data

May 24, 2019 (TW) ................................. 108206615

(51) Int. Cl.
*H05K 7/14* (2006.01)
*G06F 1/18* (2006.01)
*G11B 33/12* (2006.01)

(52) U.S. Cl.
CPC .......... *H05K 7/1489* (2013.01); *G06F 1/187* (2013.01); *G11B 33/128* (2013.01)

(58) Field of Classification Search
CPC .. H05K 7/1489; G11B 33/128; G11B 33/124; G06F 1/187
See application file for complete search history.

(56) References Cited

U.S. PATENT DOCUMENTS

| | | | |
|---|---|---|---|
| 9,042,094 B2* | 5/2015 | Williams | G11B 33/00 361/679.39 |
| 9,456,515 B2 | 9/2016 | Pecone et al. | |
| 9,823,714 B2* | 11/2017 | Yang | G06F 1/187 |
| 10,600,450 B2* | 3/2020 | Chang | G11B 33/124 |
| 10,827,637 B2* | 11/2020 | Wang | G06F 1/187 |
| 10,842,037 B2* | 11/2020 | Wang | G06F 1/187 |
| 2013/0229766 A1* | 9/2013 | Williams | G11B 33/128 361/679.33 |
| 2014/0204525 A1 | 7/2014 | Pecone et al. | |
| 2015/0009619 A1* | 1/2015 | Yin | G11B 33/128 361/679.39 |

(Continued)

FOREIGN PATENT DOCUMENTS

| | | |
|---|---|---|
| TW | M354309 U | 4/2009 |
| TW | M516213 U | 1/2016 |

(Continued)

*Primary Examiner* — Kimberley S Wright
(74) *Attorney, Agent, or Firm* — CKC & Partners Co., LLC

(57) ABSTRACT

A storage device includes a casing, a bracket and a stopper. The casing includes a receiving recess and a guiding slot. The casing includes two partition units and a guiding slot. The guiding slot is formed on one of the partition units, and provided with a detaching hole, and a receiving recess is formed between the partition units. The bracket includes a rack and a hanging portion. The rack is received within the receiving recess for fixedly holding a loaded object. The hanging portion is fixedly connected to the rack, slidably engaged with the guiding slot, and releasable from the guiding slot through the detaching hole. The stopper is removably located in the detaching hole for stopping the hanging portion from moving into the detaching hole.

8 Claims, 12 Drawing Sheets

(56) References Cited

U.S. PATENT DOCUMENTS

| | | | | |
|---|---|---|---|---|
| 2015/0293566 A1* | 10/2015 | Ehlen | ................ | H05K 7/20718 |
| | | | | 361/679.33 |
| 2017/0188478 A1* | 6/2017 | Wang | ................... | G11B 33/124 |
| 2017/0228000 A1* | 8/2017 | Yang | ................... | G11B 33/128 |
| 2019/0075668 A1* | 3/2019 | Adrian | ................ | H05K 5/0221 |
| 2019/0096442 A1* | 3/2019 | Hu | ....................... | G11B 33/127 |
| 2019/0325917 A1* | 10/2019 | Chang | ................. | G11B 33/124 |
| 2020/0372938 A1* | 11/2020 | Wang | ................... | G11B 33/022 |

FOREIGN PATENT DOCUMENTS

| | | |
|---|---|---|
| TW | M527670 U | 8/2016 |
| TW | I586247 B | 6/2017 |

\* cited by examiner

STORAGE DEVICE

CROSS-REFERENCE TO RELATED APPLICATION

This application claims priority to Taiwan Application Serial Number 108206615, filed on May 24, 2019, which is herein incorporated by reference.

BACKGROUND

Technical Field

The present disclosure relates to a storage device. More particularly, the present disclosure relates to a storage device having a detachable bracket.

Description of Related Art

An existing server chassis may load with multiple removable hard disks for storing a relatively large amount of data, thereby expanding the functions of the server. These removable hard disks are exchangeable on the server chassis so as to hot swap one of the removable hard disks.

The current server chassis uses a trayless-design structure for loading these removable hard disks. However, the process of removing the trayless-design structure from the server chassis is quite time-consuming, thereby resulting in many inconveniences and troubles.

Therefore, how to develop a solution to improve the foregoing deficiencies and inconvenience is an urgent and important issue for related industry.

SUMMARY

One aspect of the present disclosure is to provide a storage device to solve the aforementioned problems of the prior art.

In one embodiment of the disclosure, the storage device includes a casing, a bracket and a stopper. The casing includes at least two partition units and at least one guiding slot. The guiding slot is formed on one of the partition units, and provided with a detaching hole. A receiving recess is formed between the partition units. The bracket includes a rack and a hanging portion. The rack is received within the receiving recess for fixedly holding a loaded object. The hanging portion is fixedly connected to the rack, slidably engaged with the guiding slot, and releasable from the guiding slot through the detaching hole. The stopper is removably located in the detaching hole for stopping the hanging portion from moving into the detaching hole.

According to one or more embodiments of the disclosure, in the foregoing storage device, the guiding slot further includes an elongated groove. The detaching hole is formed on one end of the elongated groove, and a width of the detaching hole is greater than a width of the elongated groove.

According to one or more embodiments of the disclosure, in the foregoing storage device, the stopper further includes an elastic sheet and at least one stopping block. One end of the elastic sheet is connected to the casing, the other end of the elastic sheet is a free end. The stopping block is disposed on the free end of the elastic sheet, and located within the detaching hole. When the free end of the elastic sheet is pressed to move out the stopping block from the detaching hole, the hanging portion is allowed to be separated from the receiving recess through the detaching hole.

According to one or more embodiments of the disclosure, in the foregoing storage device, the guiding slot has an imaginary long axis, and the rack includes a through hole. The through hole and the hanging portion are commonly located along the imaginary long axis of the guiding slot.

According to one or more embodiments of the disclosure, in the foregoing storage device, the elastic sheet is in an L shape. The elastic sheet includes a fixed portion. the fixed portion is opposite to the free end of the elastic sheet for fixing the elastic sheet on one surface of the one of the partition units opposite to the receiving recess. The stopping block extends towards the receiving recess through the detaching hole.

According to one or more embodiments of the disclosure, in the foregoing storage device, the elastic sheet is in a T shape. The elastic sheet includes a first portion and a second portion which are perpendicular with each other. The first portion is fixed on one surface of the one of the partition units opposite to the receiving recess, and connected to a long side of the second portion. Thus, when the bracket, the guiding slot and the stopping block are two in number, the first portion is located between the stopping blocks, and the stopping blocks are formed on the long side of the second portion for stopping the brackets from leaving the guiding slots, respectively.

According to one or more embodiments of the disclosure, in the foregoing storage device, the stopping block is formed with a recessed portion. The recessed portion is located within the detaching hole, and faces towards the guiding slot, for complementarily receiving one part of the hanging portion.

According to one or more embodiments of the disclosure, in the foregoing storage device, the bracket further includes a cover plate pivotally connected to one end of the rack for removably covering the receiving recess. The stopper is located between the cover plate and the hanging portion.

According to one or more embodiments of the disclosure, in the foregoing storage device, the partition units are located at a top portion and a bottom portion of the casing, respectively.

Thus, based on the embodiments above, when a user pulls the bracket out of the receiving recess, since the stopper stops the hanging portion from moving into the detaching hole, the bracket will not be drawn out of the receiving slot, reducing the risk of damage to the loaded object due to falling. Furthermore, when the user is desired to draw the bracket out of the receiving slot, as long as the stopper is pressed down in the detaching hole to empty the detaching hole, the bracket can be withdrawn outwardly by the user. Therefore, once the hanging portion leaves the guiding slot from the detaching hole, the bracket can be removed from the receiving slot. Therefore, it is convenient for subsequent replacement and maintenance of the bracket.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and, together with the description, serve to explain the principles of the disclosure. In the drawings.

DETAILED DESCRIPTION

Figure 1:
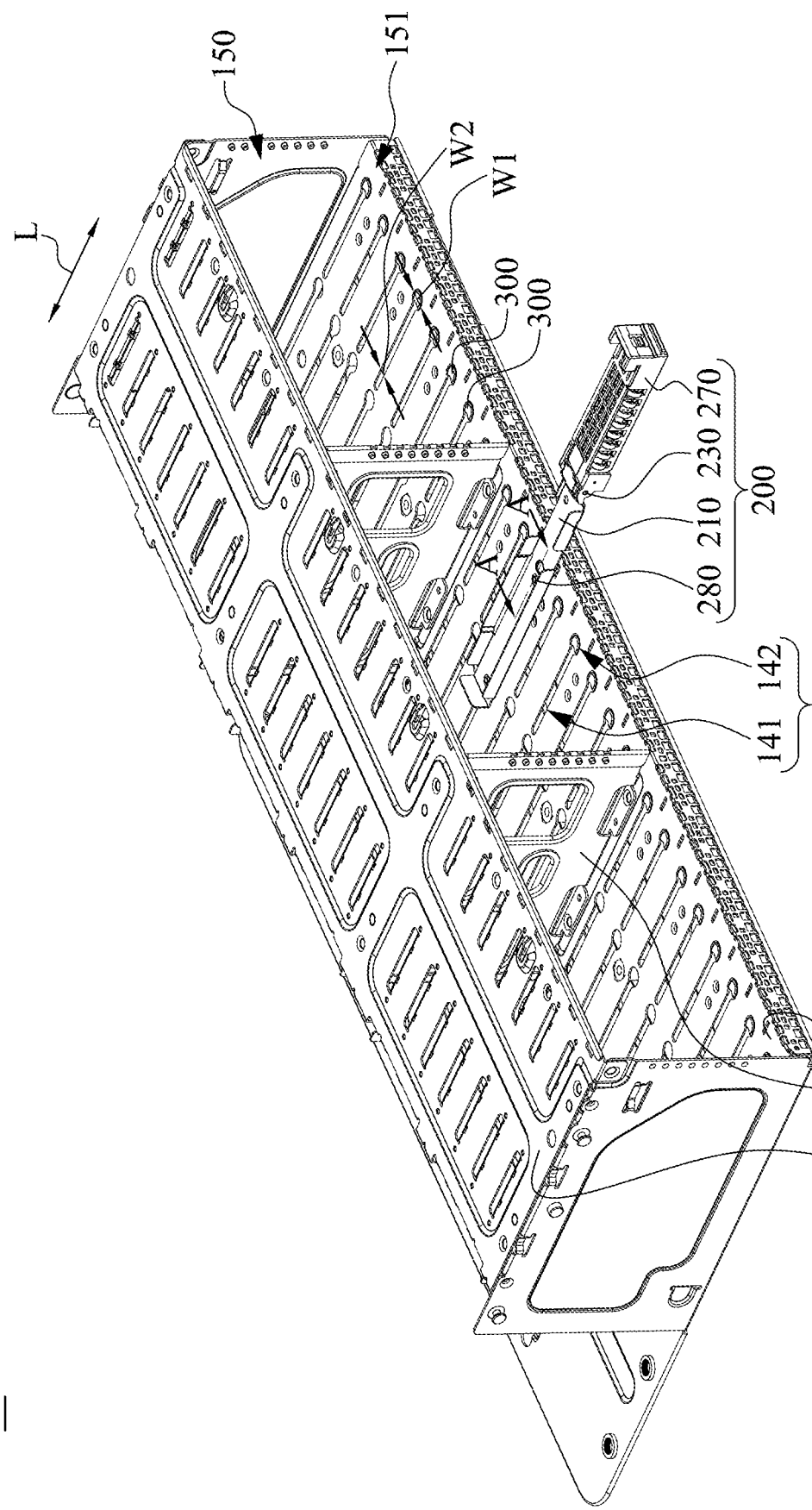
FIG. 1 is a perspective schematic view of a storage device according to one embodiment of present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
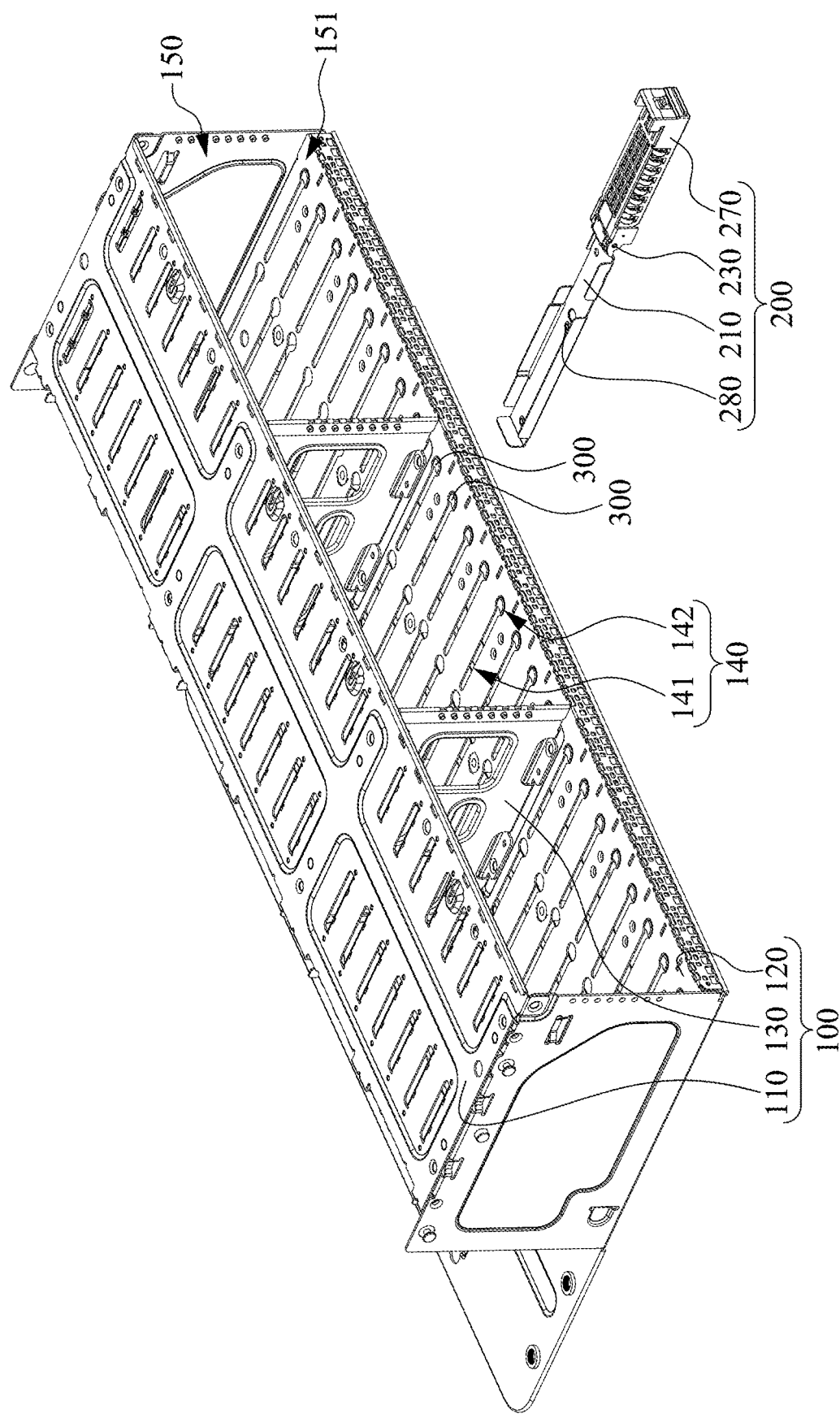
FIG. 2 is an exploded view of the storage device of FIG. 1.
Figure 3:
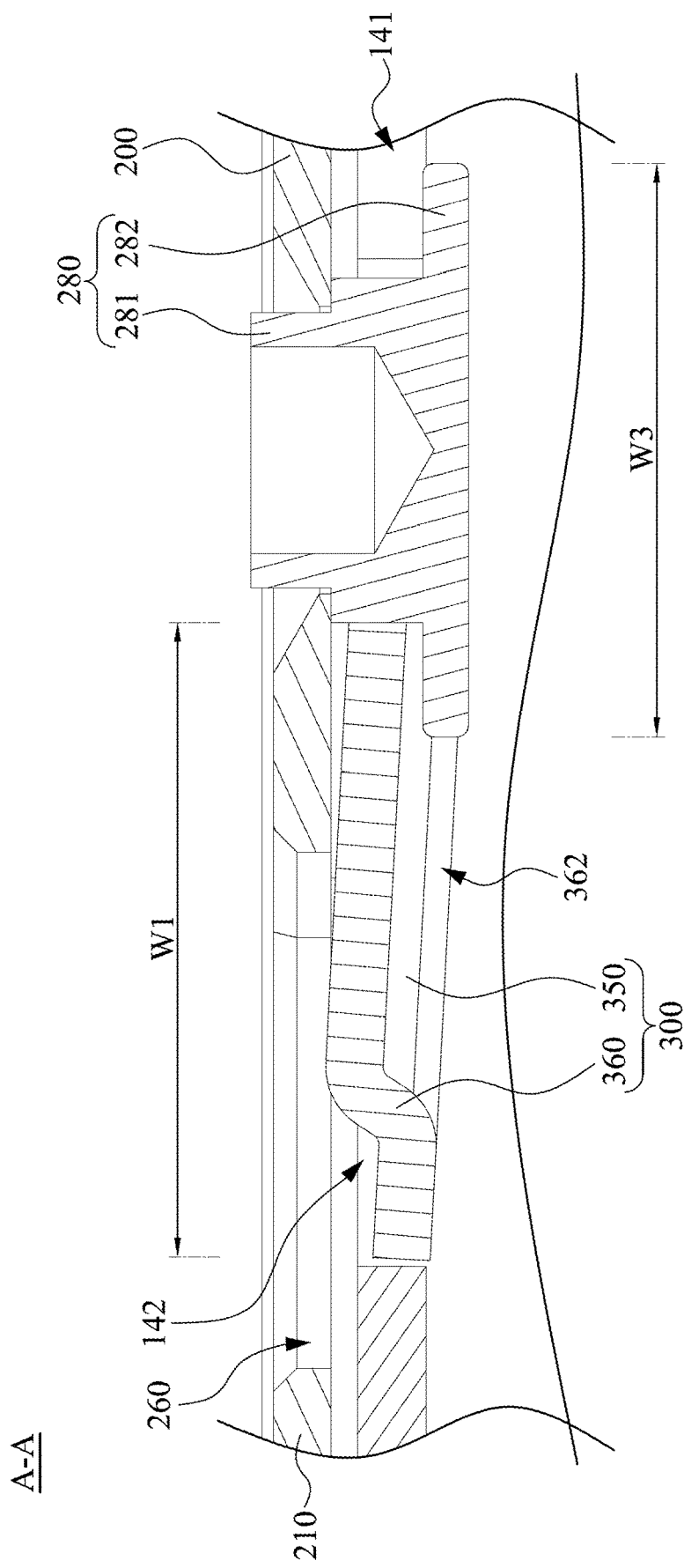
FIG. 3 is a partial cross-sectional view of the storage device of FIG. 1 viewed along a line A-A.

Reference is now made to FIG. 1 to FIG. 3 in which FIG. 1 is a perspective schematic view of a storage device 10 according to one embodiment of present disclosure, FIG. 2 is an exploded view of the storage device 10 of FIG. 1, and FIG. 3 is a partial cross-sectional view of the storage device of FIG. 1 viewed along a line A-A. As shown in FIG. 1 to FIG. 3, in one embodiment, the storage device 10 includes a casing 100, a bracket 200 and a stopper 300. The casing includes a plurality of partition units and a plurality of guiding slots 140. A receiving recess 150 is formed between the partition units. In the embodiment, the partition units are located at a top portion, a bottom portion and a location between the top portion and the bottom portion of the casing 100, respectively, hereinafter referred to as an upper partition unit 110, a lower partition unit 120 and intermediate partition units 130. The guiding slots 140 are respectively arranged on the lower partition unit 120 in parallel. The guiding slot includes an elongated groove 141 extending along a long axis direction (see long axis line L), and a detaching hole 142 formed on one end of the elongated groove 141, and a width W1 (i.e., caliber) of the detaching hole 142 is greater than a width W2 of the elongated groove 141. The bracket 200 includes a rack 210, a cover plate 270 and a hanging portion 280. The rack 210 is received within the receiving recess 150 for fixedly holding a loaded object (not shown). The loaded object for example, is a bare disk or a circuit board etc. The hanging portion 280 is fixedly connected to the rack 210, slidably engaged with the guiding slot 140, and releasable from the guiding slot 140 through the detaching hole 142. The stopper 300 is located between the cover plate 270 and the hanging portion 280, and removably located in the detaching hole for stopping the hanging portion 280 from moving into the detaching hole 142.

Figure 4:
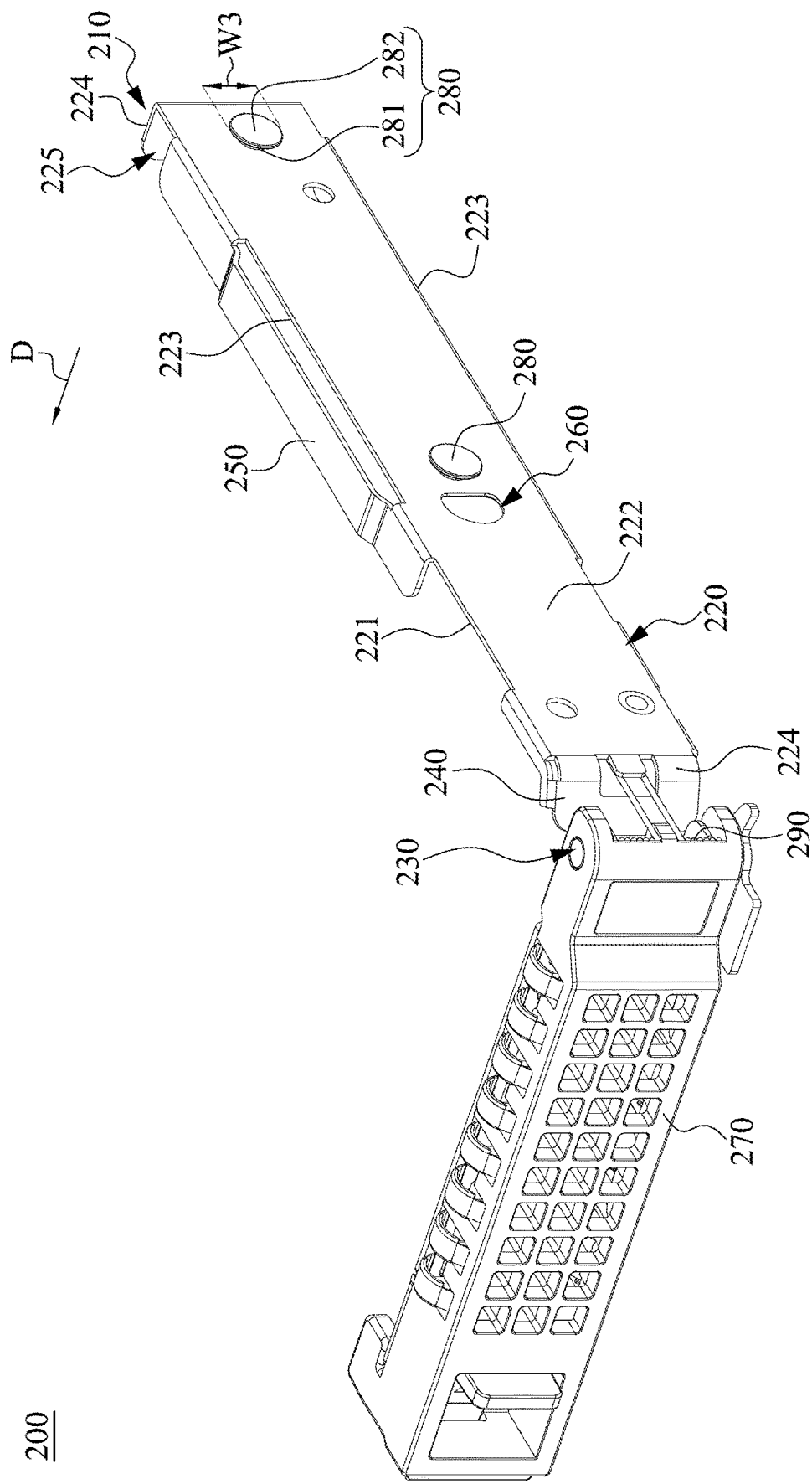
FIG. 4 is a perspective schematic view of the bracket of FIG. 2 viewed by another viewing aspect.

FIG. 4 is a perspective schematic view of the bracket 200 of FIG. 2 viewed by another viewing aspect. As shown in FIG. 1 and FIG. 4, based on the aforementioned structure above, when a user pulls the bracket 200 out of the receiving recess 150, since the stopper 300 stops the hanging portion 280 from moving into the detaching hole 142, the loaded object carried on the bracket 200 at most can be moved to a recess outlet 151 of the receiving recess 150 only, thereby, reducing the risk of damage to the loaded object due to falling.

More specifically, as shown in FIG. 1 and FIG. 4, the rack 210 includes a strip-shaped plate body 220, a pivot portion 230, two first side portions 240 and two second side portions 250. The strip-shaped plate body 220 includes a front surface 221, a back surface 222, two long sides 223 and two short sides 224. The front surface 221 and the back surface 222 are opposite to each other, the long sides 223 are opposite to each other, the short sides 224 are opposite to each other, and the long sides 223 and the short sides 224 collectively surround the front surface 221 and the back surface 222 together. Each of the long sides 223 is located between the short sides 224 and adjoins the short sides 224, and each of the short sides 224 is located between the long sides 223 and adjoins the long sides 223 respectively. The first side portions 240 are respectively located at two opposite ends of the strip-shaped plate body 220, that is, respectively located at the short sides 224 of the strip-shaped plate body 220. The second side portions 250 are respectively located on the long sides 223. One of the first side portions 240 and the second side portions 250 both extend in the same direction D, so that the first side portion 240, the second side portions 250, and the strip-shaped plate body 220 jointly define a holding space 225. The holding space 225 is used to hold the object (not shown). The pivot portion 230 is located on another first side portion 240 so that the cover plate 270 is rotatably connected to the rack 210 through the pivot portion 230. The strip-shaped plate body 220 includes a through hole 260. The through hole 260 penetrates through the strip-shaped plate body 220 to connect to both of the front surface 221 and the back surface 222. The through hole 260 is in communication with the holding space 225, and is formed on the strip-shaped plate body 220 only. Both of the through hole 260 and the hanging portion 280 are arranged along the long axis direction of the guiding slot 140 (see the imaginary long axis L, FIG. 1), and the through hole 260 is interposed between the hanging portion 280 and the pivot portion 230. The hanging portion 280 is located on the back surface 222 of the strip-shaped plate body 220. A width W1 of the detaching hole 142 is greater than a width W3 of the hanging portion 280. Therefore, the bracket 200 can slide reciprocatedly on the lower partition unit 120 with the hanging portion 280. The hanging portion 280 is, for example, a T-nail, and the hanging portion 280 includes a nail body 281 and a nail head 282. One end of the nail body 281 is connected to the strip-shaped plate body 220, and the other end of the nail body 281 is connected to the nail head 282 so as to be slidably located in the elongated groove 141. The width W3 of the nail head 282 is greater than the width W2 of the elongated groove 141, and smaller than the width W1 of the detaching hole 142.

Furthermore, in the embodiment, the strip-shaped plate body 220, the pivot portion 230, the first side portions 240 and the second side portions 250 are formed integrated, however, the disclosure is not limited thereto.

In this embodiment, for example but not for the limitation of the disclosure, the bracket 200 further includes an elastic element 290, and the elastic element 290 is located on the pivot portion 230 to abut against the cover plate 270 and the strip plate body 220. The resilient force of the elastic element 290 is used to move the cover plate 270 back to the original position.

Figure 5:
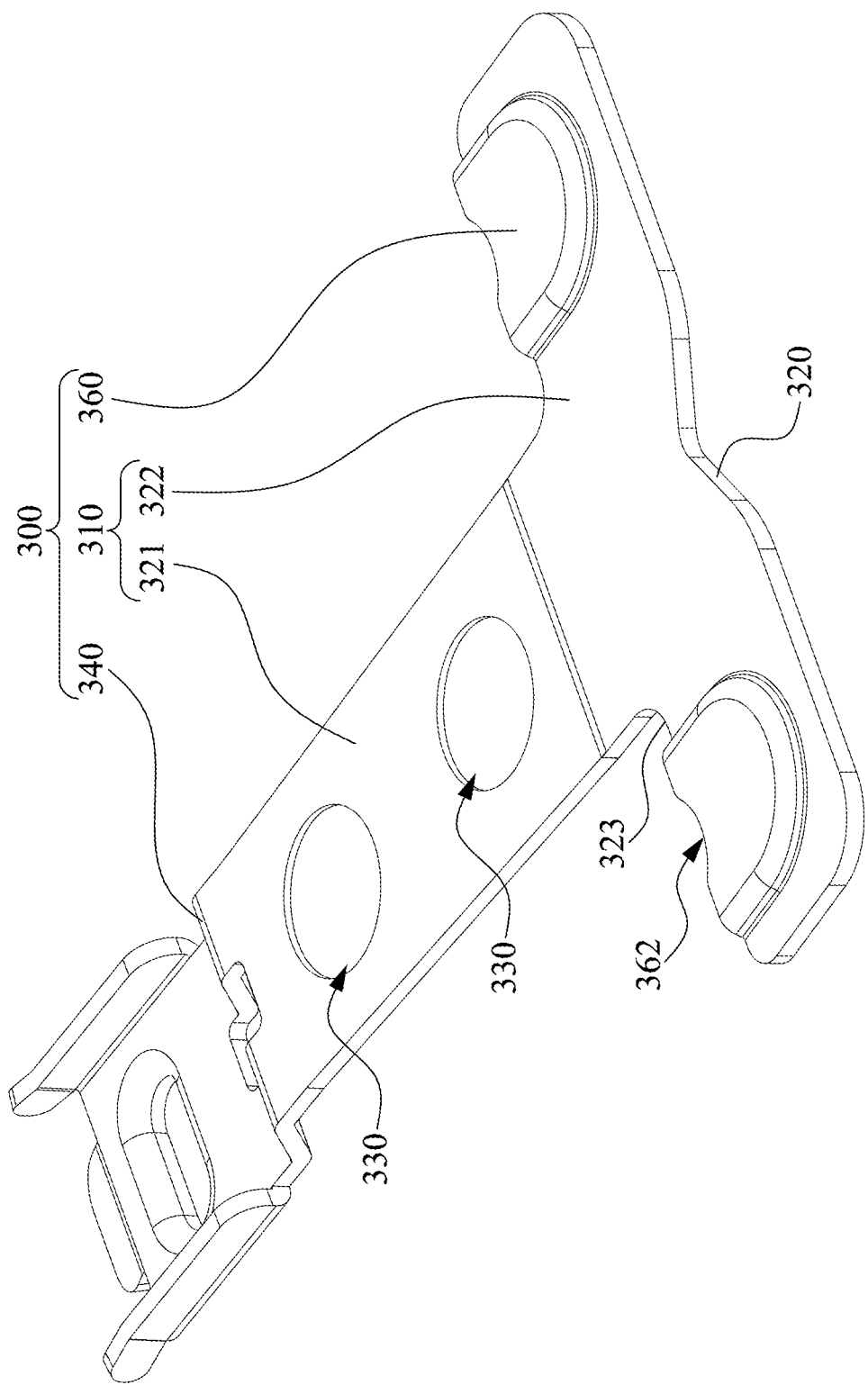
FIG. 5 is a perspective schematic view of the stopper according to one embodiment of present disclosure.

FIG. 5 is a perspective schematic view of the stopper 300 according to one embodiment of present disclosure. As shown in FIG. 3 and FIG. 5, more specifically, the stopper 300 further comprises an elastic sheet 310 and at least one stopping block 360. One end of the elastic sheet 310 is connected to the casing 100, the other end of the elastic sheet 310 is a free end 320, and the stopping block 360 is convexly disposed on the free end 320 of the elastic sheet 310, and extends into the detaching hole 142. For example, when the bracket 200 and the stopping block 360 are two in number, the elastic sheet 310 is in a T shape, and the elastic sheet 310 includes a first portion 321 and a second portion 322 which are perpendicular with each other. The first portion 321 is connected to one of the long sides 323 of the second portion 322, and located between the stopping blocks 360. The first portion 321 is fixed on one surface of the lower partition unit 120 opposite to the receiving recess 150, and the first portion 321 is disposed between any two neighboring guiding slots 140. More specifically, the first portion 321 further includes a fixed portion 330. The first portion 321 is fixed to one surface of the lower partition unit 120 opposite to the receiving recess 150 through the fixed portion 330. The stopping blocks 360 are located on the long sides 323 of the second portion 322. The stopping blocks 360 respectively extend into the two adjacent detaching holes 142 to temporarily stop the two adjacent brackets 200 from leaving the guiding slot 140, respectively. Thus, in this embodiment, each stopper 300 temporarily stops the two adjacent brackets 200, so the overall material cost and arrangement space are improved. More specifically, the elastic sheet 310 further includes a bent portion 340. The bent portion 340 is located on the first portion 321 to strengthen the resilience of the second portion 322 to push the stopping blocks 360 into the detaching hole 142.

More specifically, as shown in FIG. 3 and FIG. 5, each of the stopping blocks 360 is formed with a recessed portion 362. The recessed portion 362 is located within the corresponding detaching hole 142, and faces towards the elongated groove 141 for complementarily receiving one part of the hanging portion 280. Thus, when the user pulls the bracket 200 out of the receiving recess 150, since one part of the hanging portion 280 is complementarily received within the elongated groove 141, that is, the outer edge of the stopping block 360 abuts the nail body 281 of the hanging portion 280, and the nail head 282 of the hanging portion 280 is partially moved into the recessed portion 362.

Figure 6A:
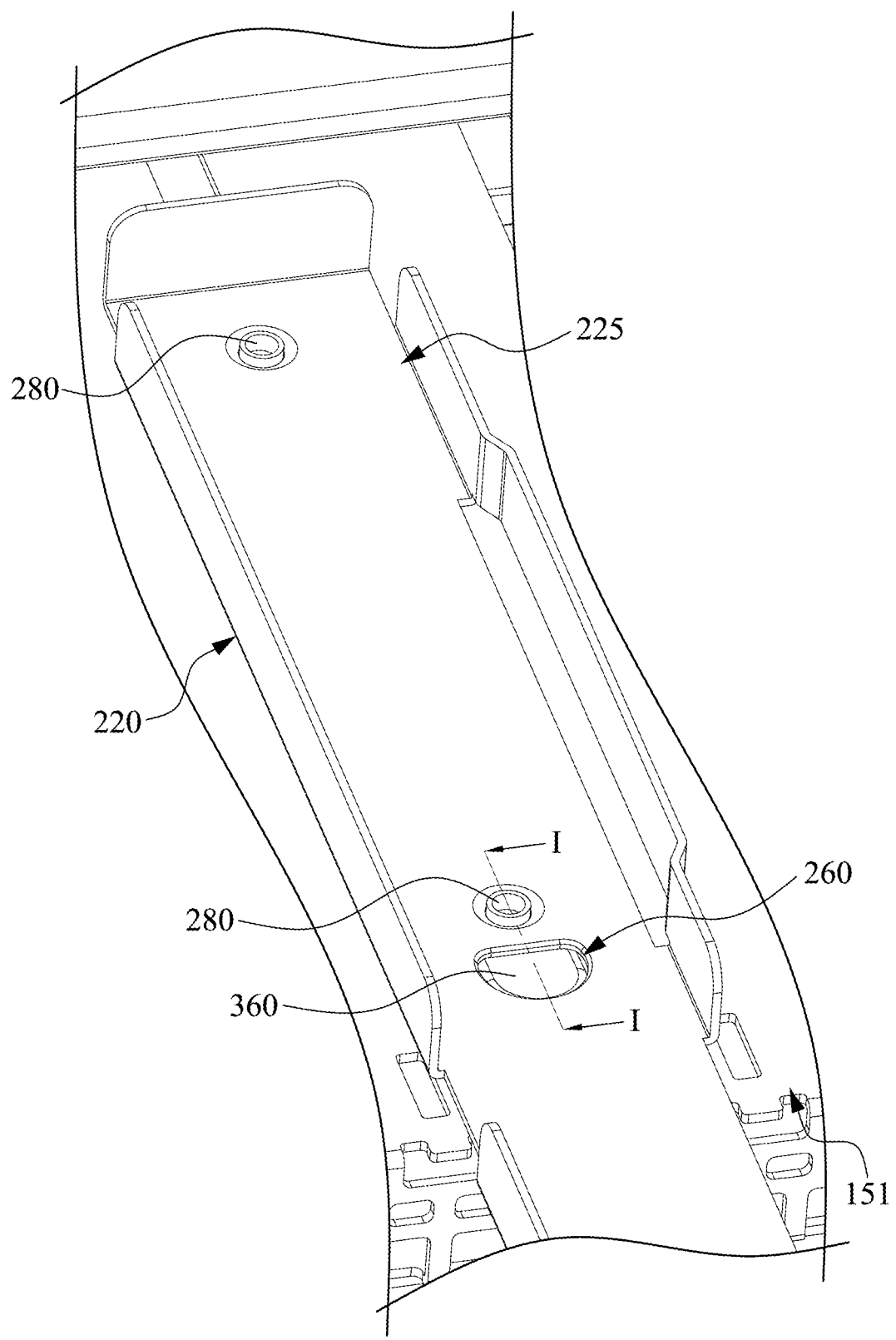
FIG. 6A to FIG. 6C are continuous operational schematic views of the bracket detached from the casing of FIG. 1.
Figure 6B:
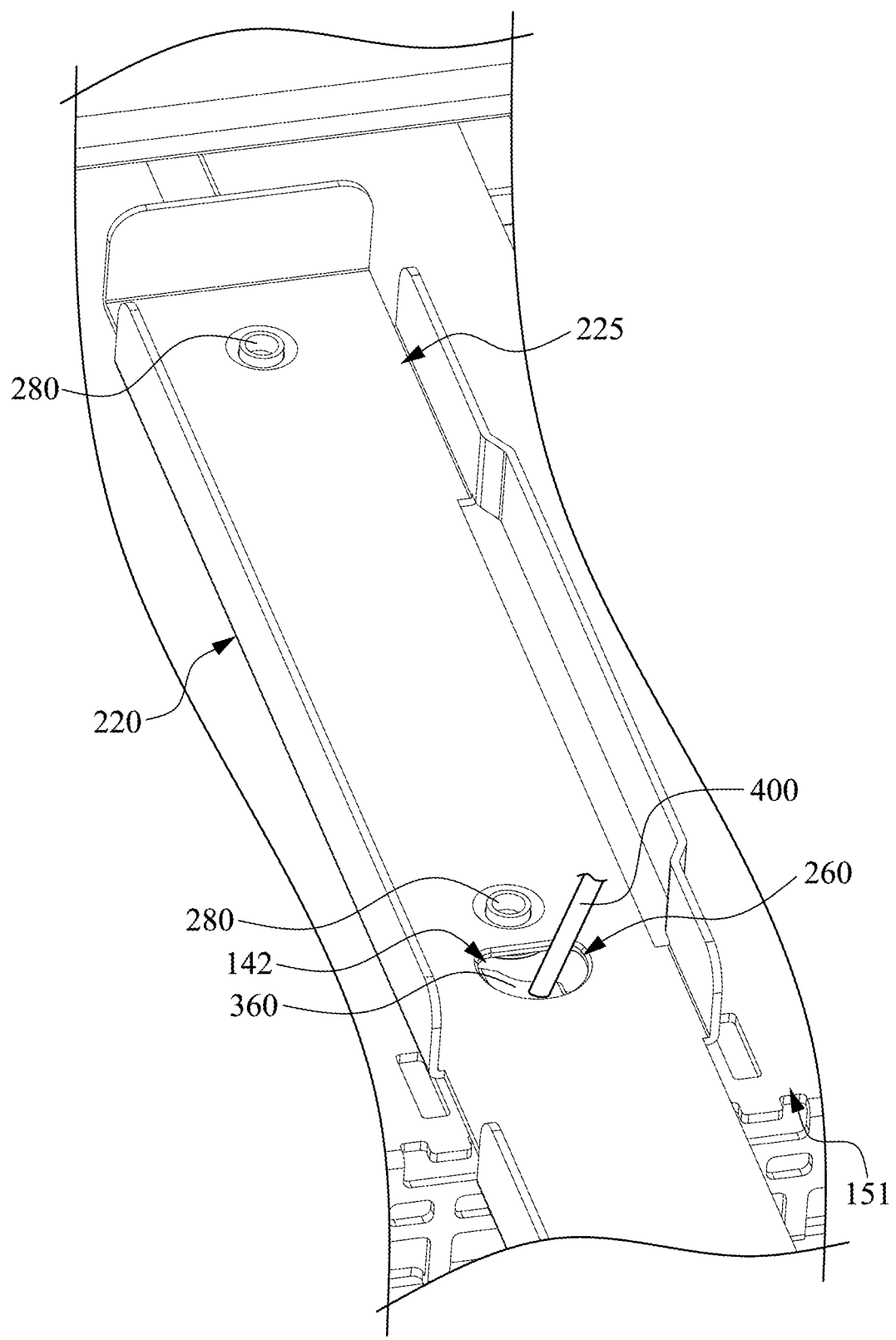
Figure 6C:
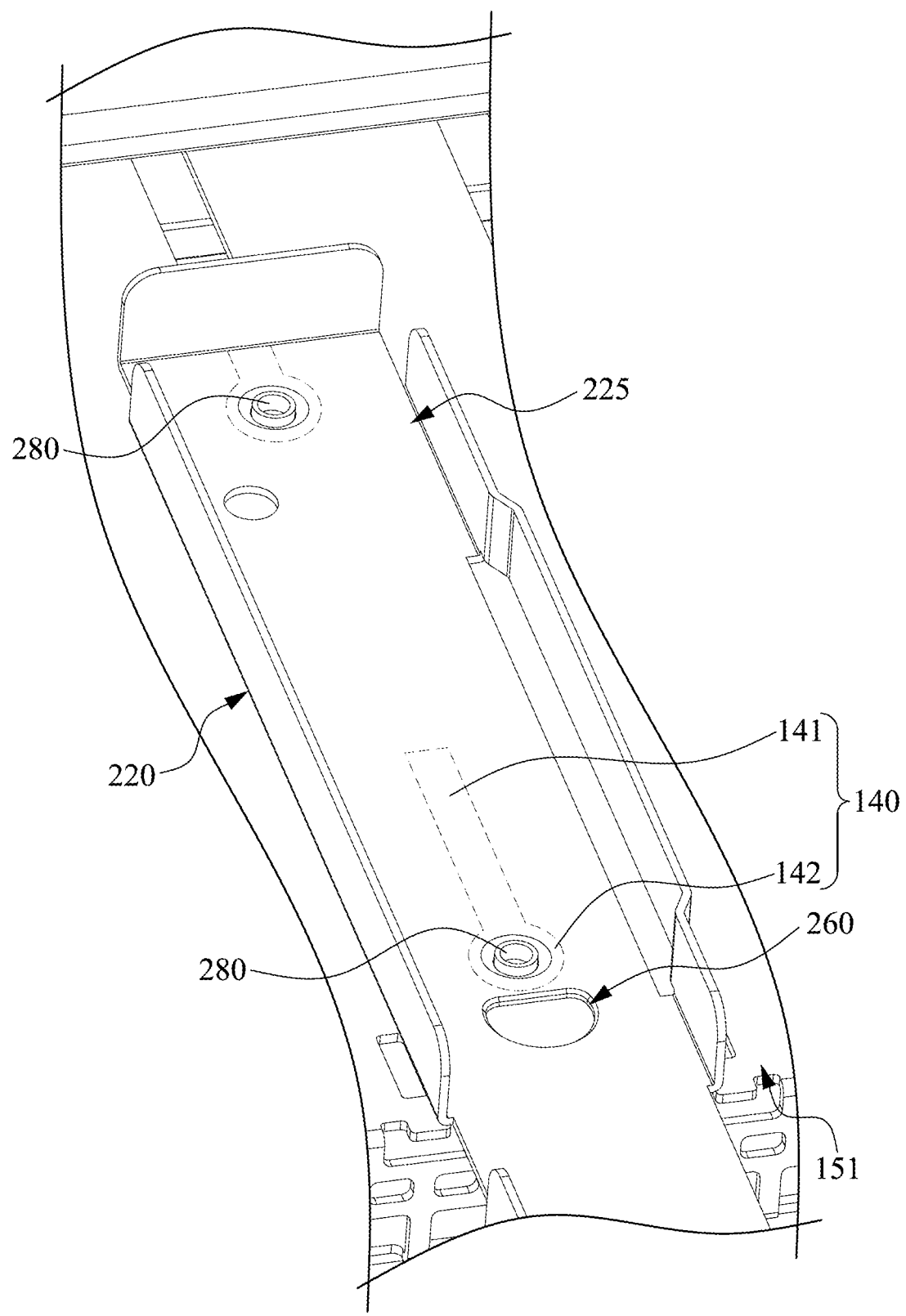
Figure 7A:
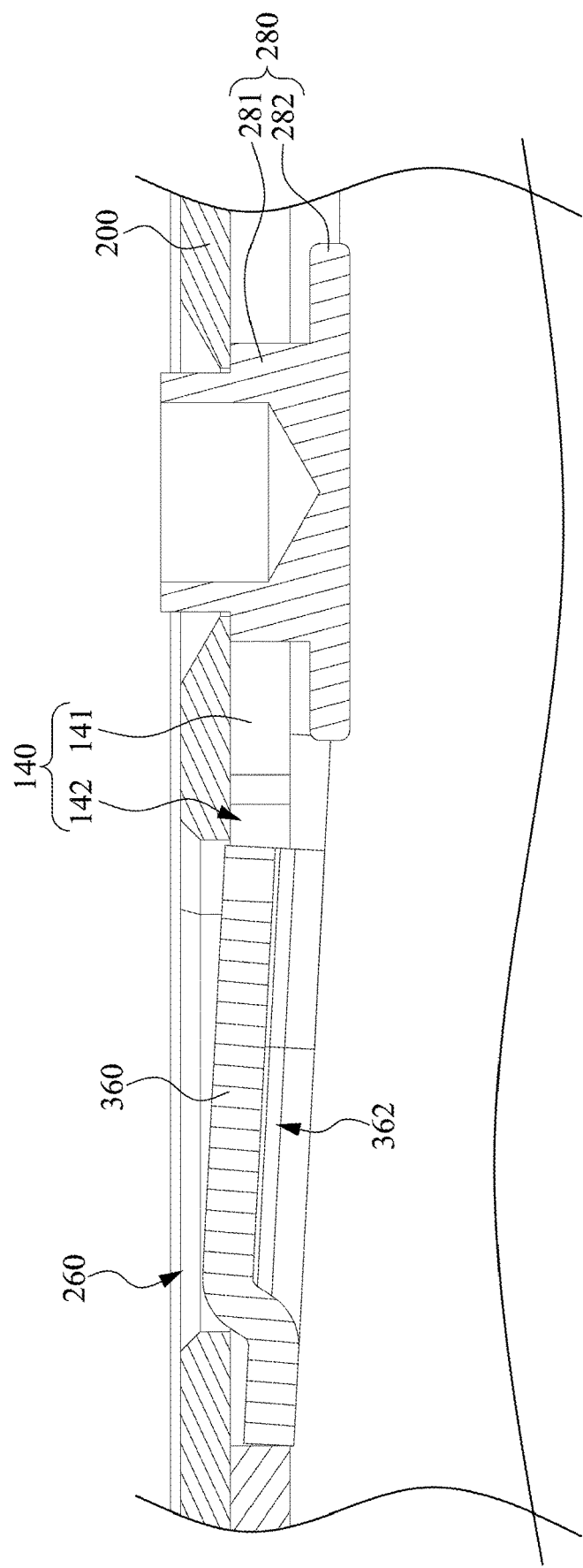
FIG. 7A to FIG. 7C are cross-sectional views of the bracket of FIG. 6A to FIG. 6C viewed along a line I-I, respectively.
Figure 7B:
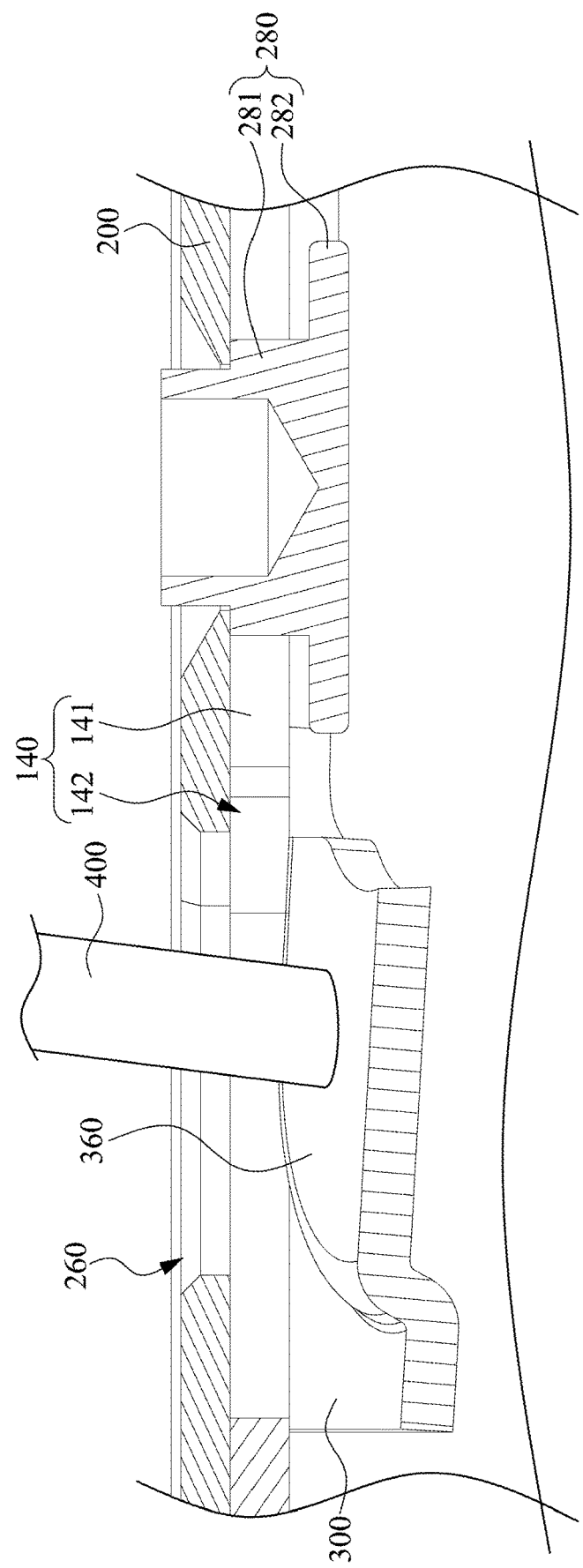
Figure 7C:
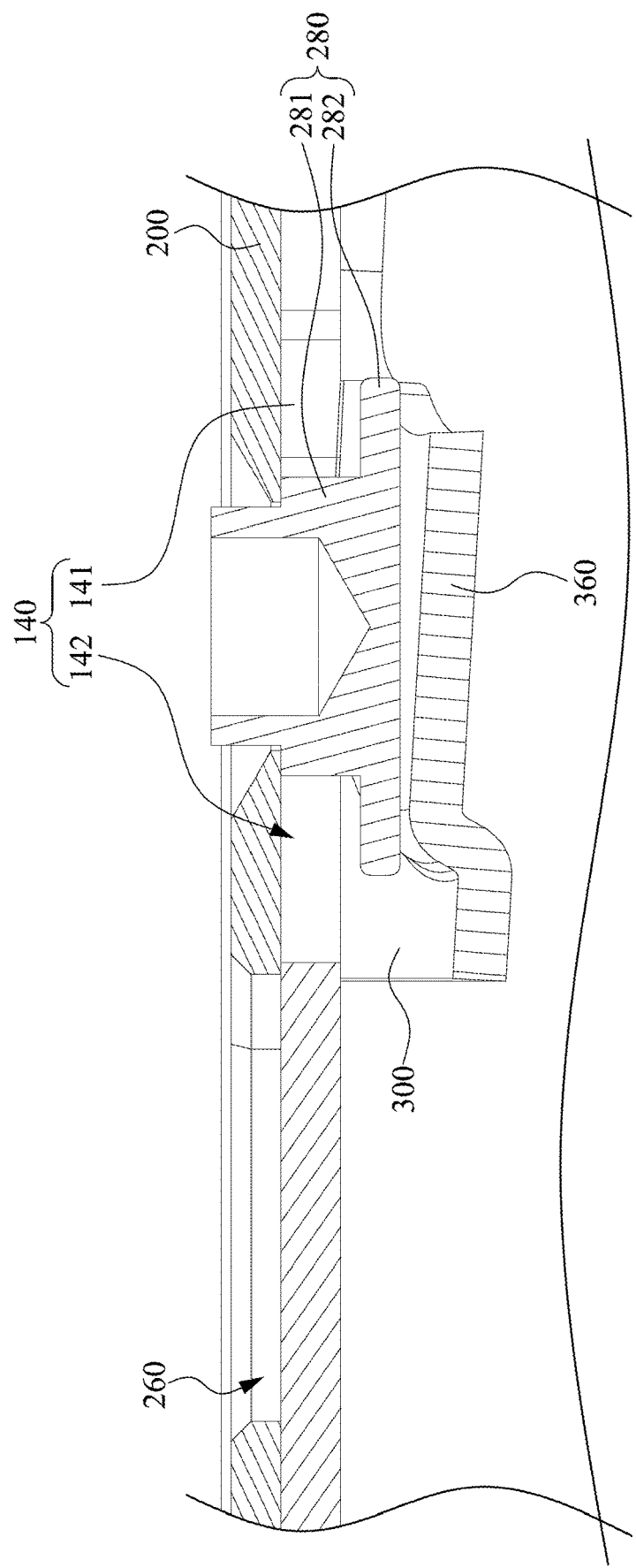

FIG. 6A to FIG. 6C are continuous operational schematic views of the bracket 200 detached from the casing 100 of FIG. 1. FIG. 7A to FIG. 7C are cross-sectional views of the bracket 200 of FIG. 6A to FIG. 6C viewed along a line I-I, respectively. As shown in FIG. 6A and FIG. 6B, when the user pulls the bracket 200 to the recess outlet 151, so that the through hole 260 moves directly above the stopping block 360 and exposes the stopping block 360 outwards from the through hole 260, the user can use a tool 400 to press the stopping block 360 in the through hole 260, so the free end 320 of the elastic sheet 310 is deformed, so that the stopping block 360 is pressed out of the detaching hole 142 to empty the detaching hole 142. Next, as shown in FIG. 6B and FIG. 6C, when the user continues to pull the bracket 200 so that the hanging portion 280 moves into the detaching hole 142, since the detaching hole 142 is larger than the nail head 282 of the hanging portion 280, the entire hanging portion 280 can be detached upward from the guiding slot 140, so that the entire bracket 200 is allowed to be separated from the receiving recess 150 through the detaching hole 142.

It is noted, as shown in FIG. 7A and FIG. 7B, since the hanging portion 280 is not overlapped by the stopping block 360, that is, the nail head 282 of the hanging portion 280 is not able to move into the recessed portion 362, the user can press down the stopping block 360 through the through hole 260, so that the stopping block 360 no longer stops the hanging portion 280 from moving. More specifically, as shown in FIG. 7C, since the stopping block 360 is no longer pressed down, the elastic force of the free end 320 of the elastic sheet 310 can push the nail head 282 of the hanging portion 280 upwards out of the detaching hole 142, thereby allowing the hanging portion 280 of the bracket 200 to be automatically pushed out of the receiving recess 150 as a whole. In this way, once the hanging portion 280 leaves the guiding slots 140 from the detaching hole 142, the bracket 200 can be moved out of the receiving recess 150. Therefore, the subsequent replacement and maintenance of the bracket 200 is facilitated.

Figure 8:
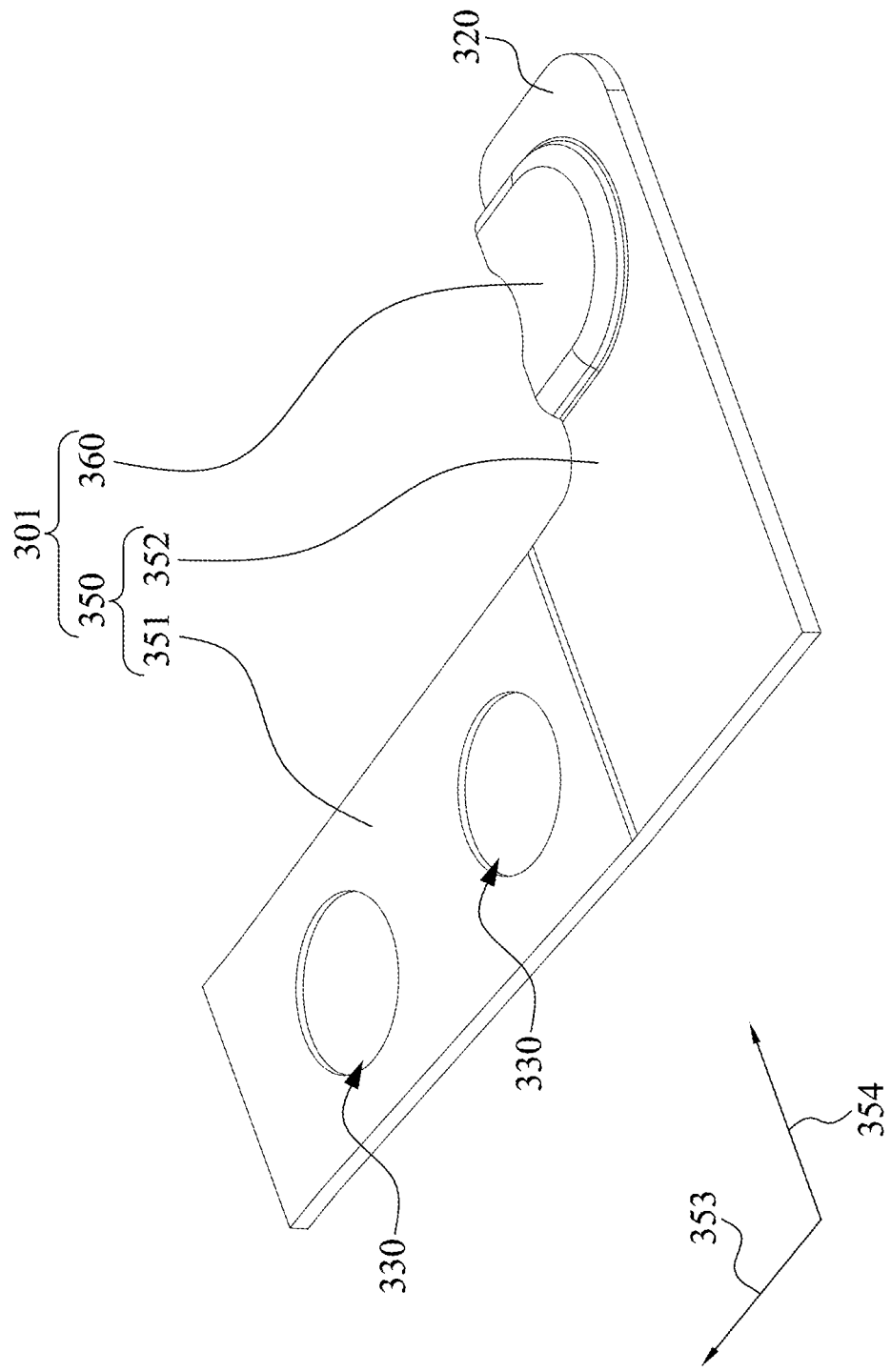
FIG. 8 is a perspective schematic view of a stopper according to one embodiment of present disclosure.

FIG. 8 is a perspective schematic view of a stopper 301 according to one embodiment of present disclosure. As shown in FIG. 8, the stopper 301 of FIG. 8 is substantially the same to the stopper 300 of FIG. 5, however, one of the differences is that the elastic sheet 310 is in an L shape, and the elastic sheet 310 includes a first arm 351 and a second arm 352. The long axis direction 353 of the first arm 351 and the long axis direction 354 of the second arm 352 intersects each other. The first arm 351 further includes a fixed portion 330. The first arm 351 is fixed to the lower partition unit 120 through the fixed portion 330, and one end of the second arm 352 being opposite to the first arm 351 is a free end 320, and the stopping block 360 is located at the free end 320 of the second arm 352.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A storage device, comprising:
a casing comprising at least two partition units and at least one guiding slot, the at least one guiding slot that is formed on one of the partition units, and provided with a detaching hole, and a receiving recess is formed between the partition units; and
at least one bracket comprising:
a rack received within the receiving recess for fixedly holding a loaded object; and
a hanging portion fixedly connected to the rack, slidably engaged with the at least one guiding slot, and releasable from the at least one guiding slot through the detaching hole; and
a stopper removably located in the detaching hole for stopping the hanging portion from moving into the detaching hole, the stopper comprising an elastic sheet and at least one stopping block, wherein one end of the elastic sheet is connected to the casing, the other end of the elastic sheet is a free end, and the at least one stopping block is disposed on the free end of the elastic sheet, and located within the detaching hole, wherein when the free end of the elastic sheet is pressed to move out the at least one stopping block from the detaching hole, the hanging portion is allowed to be separated from the receiving recess through the detaching hole.

2. The storage device of claim 1, wherein the at least one guiding slot further comprises an elongated groove,
wherein the detaching hole is formed on one end of the elongated groove, and a width of the detaching hole is greater than a width of the elongated groove.

3. The storage device of claim 1, wherein the at least one guiding slot has an imaginary long axis, and the rack comprises a through hole,
wherein the through hole and the hanging portion are commonly located along the imaginary long axis of the at least one guiding slot.

4. The storage device of claim 1, wherein the elastic sheet is in an L shape, and the elastic sheet comprises a fixed portion, the fixed portion is opposite to the free end of the elastic sheet for fixing the elastic sheet on one surface of the one of the partition units opposite to the receiving recess,
wherein the at least one stopping block extends towards the receiving recess through the detaching hole.

5. The storage device of claim 1, wherein the elastic sheet is in an T shape, and the elastic sheet comprises a first portion and a second portion which are perpendicular with each other, the first portion is fixed on one surface of the one of the partition units opposite to the receiving recess, and connected to a long side of the second portion,
wherein when the at least one bracket, the at least one guiding slot and the at least one stopping block are two in number, the first portion is located between the stopping blocks, and the stopping blocks are formed on the long side of the second portion for stopping the brackets from leaving the guiding slots, respectively.

6. The storage device of claim 1, wherein the at least one stopping block is formed with a recessed portion, the recessed portion is located within the detaching hole, and faces towards the at least one guiding slot, for complementarily receiving one part of the hanging portion.

7. The storage device of claim 1, wherein the at least one bracket further comprises a cover plate pivotally connected to one end of the rack for removably covering the receiving recess,
wherein the stopper is located between the cover plate and the hanging portion.

8. The storage device of claim 1, wherein the partition units are located at a top portion and a bottom portion of the casing, respectively.

* * * * *